(12) United States Patent
Verhaar et al.

(10) Patent No.: US 8,576,603 B2
(45) Date of Patent: Nov. 5, 2013

(54) FLASH- AND ROM-MEMORY

(75) Inventors: Rob Verhaar, Eindhoven (NL); Guido J. M. Dormans, Bemmel (NL); Maurits Storms, Best (NL); Roger Cuppens, Zonhoven (BE); Frans J. List, Eindhoven (NL); Robert H. Beurze, Molenhoek (NL)

(73) Assignee: NXP, B.V., Eindhoven (NL)

( * ) Notice: Subject to any disclaimer, the term of this patent is extended or adjusted under 35 U.S.C. 154(b) by 862 days.

(21) Appl. No.: 11/719,397

(22) PCT Filed: Nov. 8, 2005

(86) PCT No.: PCT/IB2005/053672
§ 371 (c)(1),
(2), (4) Date: Apr. 24, 2009

(87) PCT Pub. No.: WO2006/051487
PCT Pub. Date: May 18, 2006

(65) Prior Publication Data
US 2009/0296447 A1 Dec. 3, 2009

(30) Foreign Application Priority Data

Nov. 15, 2004 (EP) .................................... 04105780

(51) Int. Cl.
G11C 17/00 (2006.01)
G11C 16/04 (2006.01)
G11C 11/34 (2006.01)

(52) U.S. Cl.
USPC . 365/103; 365/104; 365/185.05; 365/185.11; 365/94

(58) Field of Classification Search
USPC .................. 365/103, 104, 185.05, 185.11, 94
See application file for complete search history.

(56) References Cited

U.S. PATENT DOCUMENTS 5,925,917 A 7/1999 Maari
(Continued)

FOREIGN PATENT DOCUMENTS

EP 0890985 A 1/1999
EP 0 957 521 A1 11/1999
(Continued)

Primary Examiner — J. H. Hur

(57) ABSTRACT

Method for conversion of a Flash memory cell on a first semiconductor device to a ROM memory cell in a second semiconductor device, the first and second semiconductor device each being arranged on a semiconductor substrate and each comprising an identical device portion and an identical wiring scheme for wiring the device portion to the Flash memory cell and to the ROM memory cell, respectively; the Flash memory cell being made in non-volatile memory technology and comprising an access transistor and a floating transistor, the floating transistor comprising a floating gate and a control gate; the ROM memory cell being made in a baseline technology and comprising a single gate transistor, which method includes manipulating a layout of at least one baseline mask as used in the baseline technology; the manipulation including: incorporating into the layout of the at least one baseline mask a layout of the Flash memory cell, and converting the layout of the Flash memory cell to a layout of one ROM memory cell by eliminating, from the at least one baseline mask, a layout for the floating transistor from the layout of the Flash memory cell and designating the layout of the access transistor of the Flash memory cell as a layout of the single gate transistor of the ROM memory cell.

19 Claims, 11 Drawing Sheets

(56) References Cited

U.S. PATENT DOCUMENTS

| | | |
|---|---|---|
| 6,459,114 B1 | 10/2002 | Nakamura et al. |
| 6,717,208 B2 | 4/2004 | Yu et al. |
| 6,803,283 B1 | 10/2004 | Chen |
| 2003/0161184 A1* | 8/2003 | Lee et al. .................. 365/185.3 |
| 2004/0084748 A1 | 5/2004 | Park |
| 2004/0195589 A1 | 10/2004 | Hsu et al. |

FOREIGN PATENT DOCUMENTS

| | | |
|---|---|---|
| EP | 0 991 118 A1 | 4/2000 |
| JP | 62-060255 A | 3/1987 |
| JP | 02-001971 A | 1/1990 |
| JP | 02-310683 A | 12/1990 |
| JP | 03-083369 A | 4/1991 |
| JP | 06-196718 A | 7/1994 |
| JP | 2002-133885 | 5/2002 |

* cited by examiner

FLASH- AND ROM-MEMORY

The present invention relates to a method for conversion of Flash-memory to ROM-memory. Also, the present invention relates to a semiconductor device comprising such a converted ROM-memory.

In current ULSI technology, many semiconductor devices are manufactured as 'system-on-chip' (SOC) devices. In such a system-on-chip, device structures which were initially fabricated separately are combined on a single chip. This allows combination of e.g., analog, bipolar, (non-volatile) memory and logic CMOS technologies on a small semiconductor area.

Usually, a mainstream process for a baseline technology is extended to embed one, or more, other technologies as an option. Typically, the baseline technology relates to CMOS technology, which requires single-level poly-Si manufacturing technology. Other technologies, such as analog, bipolar and (non-volatile) memory, which require multiple-level poly-Si manufacturing technology are embedded in the baseline technology.

In many SOC devices, a programmable non-volatile memory portion is embedded. This programmable non-volatile memory is for example a Flash memory.

Flash memory is used in SOC devices to allow programming of the SOC device's function. A program stored in flash memory may control the function of the SOC device. Especially, during a development stage of a product which comprises such a SOC device, Flash memory is helpful since the program code may require some revisions.

After the development of the product, the program code is finalized. In that case, the use of Flash memory on the SOC device is no longer necessary, and a more permanent non-volatile memory such as ROM (read-only-memory) is sufficient to hold the program code.

In many cases, the cost of SOC devices comprising Flash memory is relatively high in comparison with SOC devices comprising ROM memory, since the manufacturing of Flash memory requires additional processing steps which do not belong to the baseline CMOS technology as described above. ROM memory can however be made by baseline technology.

It is costly however to completely replace a Flash memory by a coded ROM memory by re-designing the SOC device. Typically, this would require a rearrangement of the layout of the memory and its on-chip wiring. Consequently, all of the masks would have to be redesigned in that case.

U.S. Pat. No. 6,717,208 discloses a method of disabling Flash memory to protect memory contents by means of conversion to ROM memory. This method comprises a step in which a gate mask and an implant code mask are positioned over a given Flash memory cell. A field oxide layer is then fabricated within a substrate layer of the cell through the masks logically added together. Apart from the field oxide formation, which disables a particular cell, this method leaves the converted cell as it was.

Disadvantageously, the complete process flow (including the creation of Flash memory cells) remains intact and only the aforementioned step of positioning the gate mask and implant code mask is modified. Further, it is indicated that the prior art method is intended for only a partial conversion of Flash memory cells to ROM memory-cells.

From the prior art U.S. Pat. No. 6,803,283, a method is known which can convert a Flash memory cell into a constant-OFF MOSFET by manipulating the implantation step of the LDD regions. This method requires a modification of the LDD implant mask(s) in accordance with the program code to be stored. Disadvantageously, this method may not be robust enough as the on current of such devices can be still significant.

Further, US2004/0195589 describes a method of fabricating ROM memory cells from Flash memory cells by implanting the floating gate cell channel regions with impurities of a conductivity type opposite to the channel's conductivity type. To this end, an existing mask must be modified to alter the Flash memory cells in accordance with the program code to be stored. This may have adverse implications for the magnitude of the bitline currents and for the peripheral circuitry.

More in general, the methods of the prior art have the disadvantage that a modification of the manufacturing process of the SOC devices is required at a relatively early stage in the process flow. During the incorporation of the program code into the ROM memory (i.e., customization), the SOC devices obtain their customer specific program code early in the manufacturing process, which reduces the flexibility of the high volume production process as preferred by the foundry.

It is an object of the present invention to provide a method for conversion of Flash-memory to ROM-memory, which, without any redesign of a Flash memory layout to a ROM memory layout, allows the manufacture of Flash-to-ROM converted 'system-on-chip' devices completely in the baseline process.

This object is achieved by a method for conversion of a Flash memory cell on a first semiconductor device to a ROM memory cell on a second semiconductor device, the first and second semiconductor device each being arranged on a semiconductor substrate and each comprising an identical device portion and an identical wiring scheme for wiring the device portion to the Flash memory cell and to the ROM memory cell, respectively; the Flash memory cell being made in non-volatile memory technology using at least one non-volatile technology mask and comprising an access transistor and a floating transistor, the floating transistor comprising a floating gate and a control gate; the ROM memory cell being made in a baseline technology using at least one baseline mask and comprising a single gate transistor, which method includes manipulating a layout of the at least one baseline mask; the manipulation comprising:
  incorporating into a layout of the at least one baseline mask a layout of the Flash memory cell, and
  converting the layout of the Flash memory cell in the at least one baseline mask to a layout of one ROM memory cell by eliminating, from the at least one baseline mask, a layout for the floating transistor from the layout of the Flash memory cell and designating the layout of the access transistor of the Flash memory cell as a layout of the single-gate transistor of the ROM memory cell.

The present invention offers the advantage that the location of ROM memory cells is substantially unchanged with respect to the location of the Flash memory cells. Thus, the design (layout and on-chip wiring) are unaffected and the coding of the ROM memory cells corresponds with the code as stored in the Flash memory cells. The risk of introducing new sources of errors is thus kept to a minimum.

In a first preferred embodiment, the present invention relates to the method as described above, wherein the Flash memory cell is paired with a second Flash memory cell that shares a common contact, and the manipulation of the at least one baseline mask comprises:
  elimination of a layout of the common contact from the at least one baseline mask, and
  creating a layout for a ROM memory cell contact at the location of the former floating transistor.

In this embodiment, the program code as developed in Flash is to be implemented at the level of the ROM cell contacts. The invention offers the advantage that the baseline technology process flow for a given type of SOC device can be performed in a flexible manner irrespective of the customization that will take place at a relatively late stage of the manufacturing process.

In a second preferred embodiment, the present invention relates to the method as described above, wherein the Flash memory cell is paired with a second Flash memory cell that shares a common contact, and the manipulation of the at least one baseline mask comprises:

elimination of the layout of the floating transistor from the at least one baseline mask, and creating a layout for a connection path between the common contact and the single-gate transistor.

In this embodiment, the program code as developed in Flash is to be implemented at the level of active area connections between the single-gate transistor and one contact of the ROM memory cell. Here, the invention offers the advantage that the manipulation of baseline masks is relatively minimal and relatively simple.

Furthermore, in accordance with the present invention, the conversion of the Flash memory cells and of the peripheral circuitry of the Flash memory to baseline technology transistors without changing the wiring between cells and peripheral circuitry provides the possibility to maintain at least a reading operation from the ROM memory cells with characteristics equivalent to those of the reading operations from Flash memory cells.

The present invention also relates to a semiconductor device comprising a ROM memory cell converted from a first semiconductor device comprising a Flash memory cell; the first and second semiconductor device each comprising an identical device portion and an identical wiring scheme for wiring the device portion to the Flash memory cell and to the ROM memory cell, respectively, wherein
the Flash memory cell has been replaced by the ROM memory cell during lithographic processing by:

incorporating into a layout of at least one baseline mask a layout of the Flash memory cell, and converting the layout of the Flash memory cell to a layout of the ROM memory cell by eliminating, from the at least one baseline mask, a layout for the floating transistor from the layout of the Flash memory cell and designating the layout of the access transistor of the Flash memory cell as a layout of the single gate transistor of the ROM memory cell.

Moreover, the present invention relates to a computer program for carrying out calculations on the layout of the baseline masks in accordance with the method of Flash-to-ROM conversion, wherein the computer program, after being loaded on a computer, allows the computer to carry out the following operations: manipulating a layout of at least one baseline mask as used in the baseline technology; the manipulation comprising:

incorporating into a layout of the at least one baseline mask a layout of a Flash memory cell, and converting the layout of the Flash memory cell in the at least one baseline mask to a layout of a ROM memory cell by eliminating, from the at least one baseline mask, a layout for the floating transistor from the layout of the Flash memory cell and designating a layout of the access transistor of the Flash memory cell as a layout of the single gate transistor of the ROM memory cell.

Below, the invention will be explained with reference to some drawings, which are intended for illustration purposes only and not to limit the scope of protection as defined in the accompanying claims.

Figure 9:
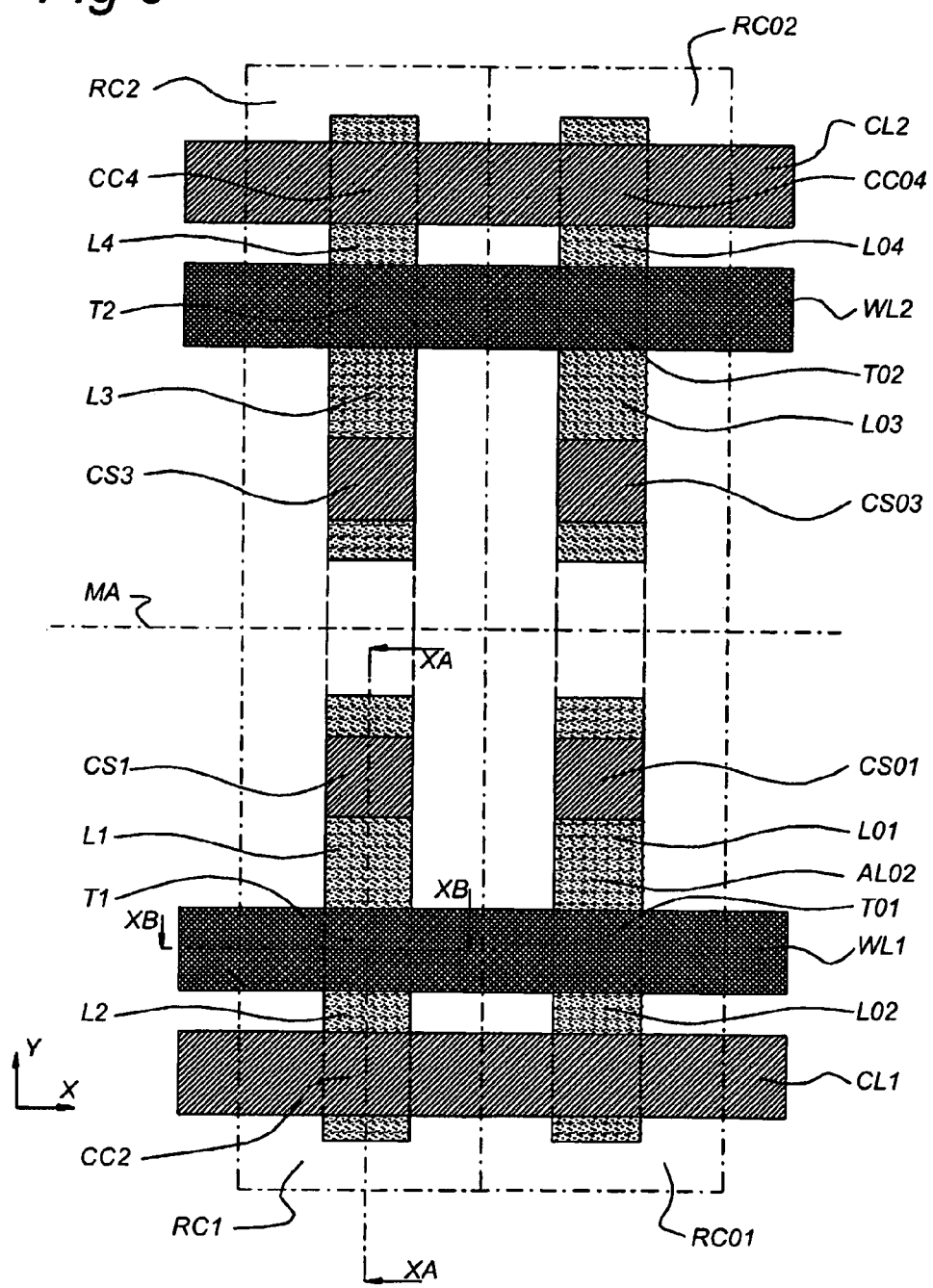
FIG. 9 shows a plane view of a layout of ROM memory cells converted in accordance with a first embodiment of the present invention.
Figure 10A:
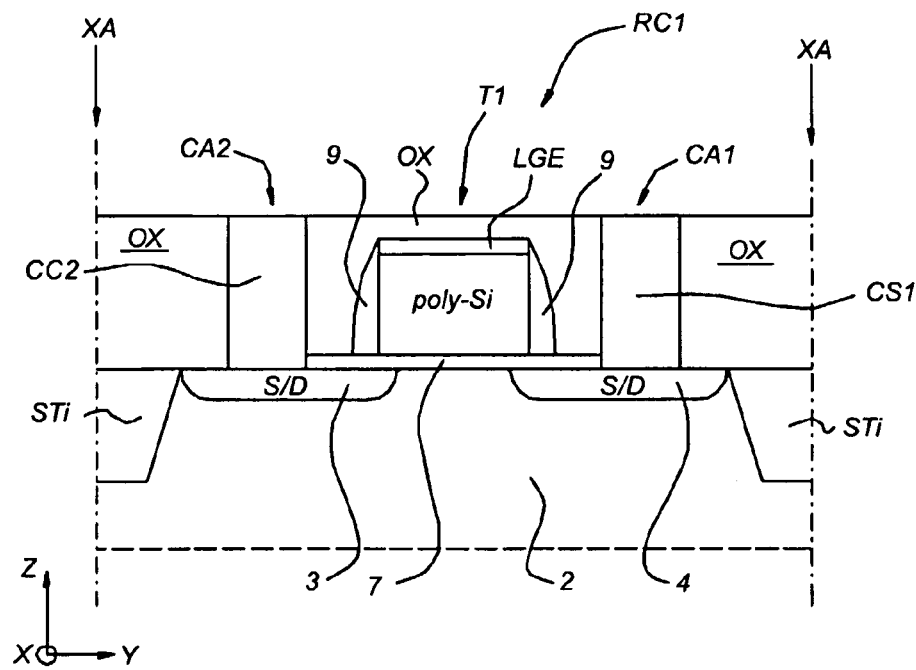
Figure 10B:
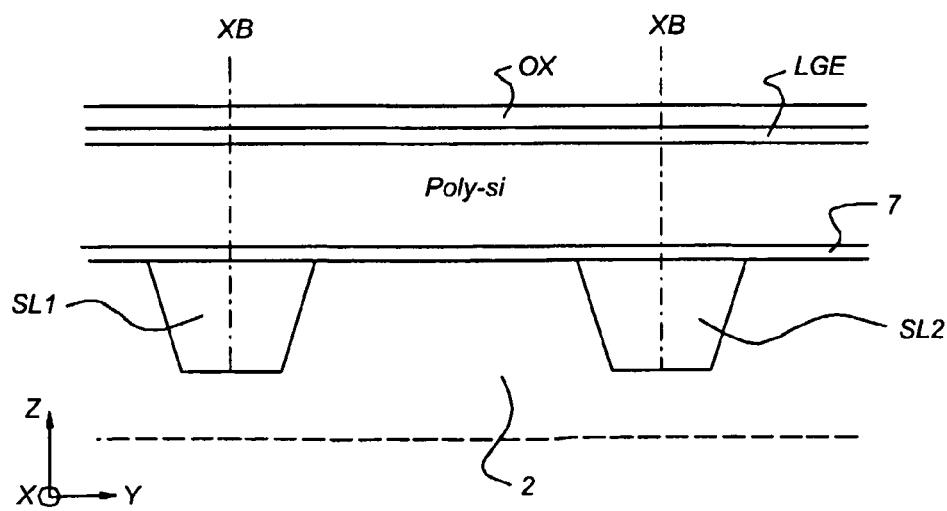
Figure 11A:
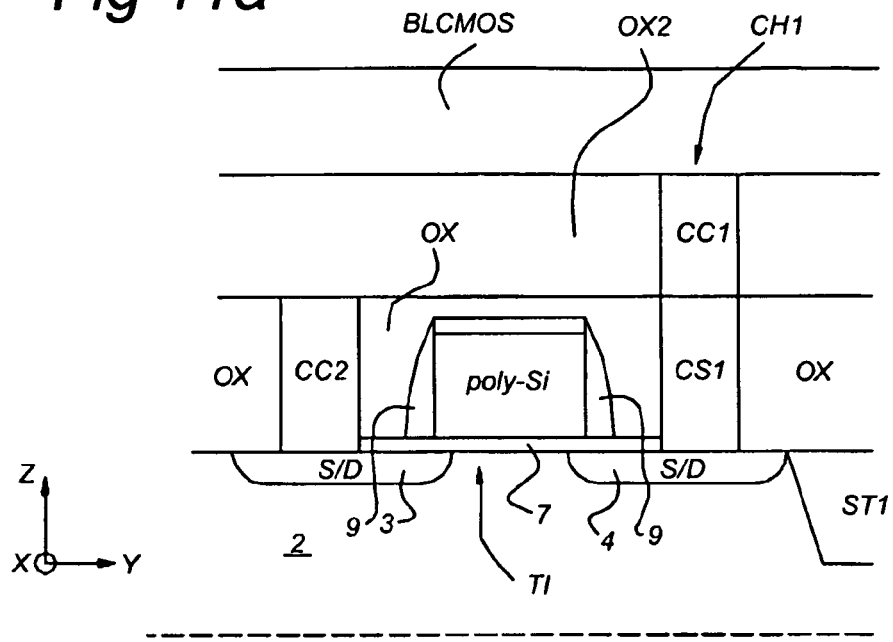
Figure 11B:
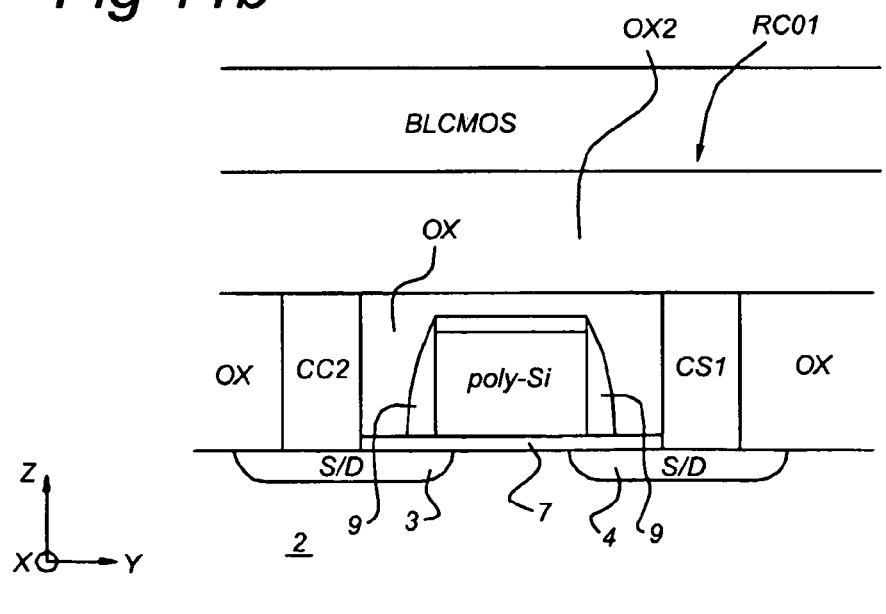
Figure 12:
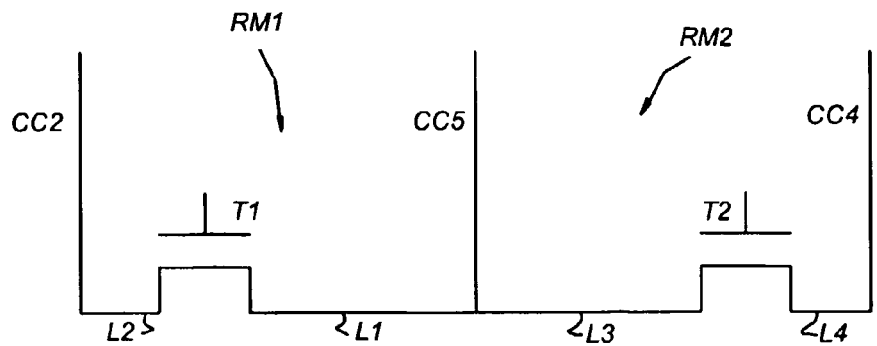
Figure 13:
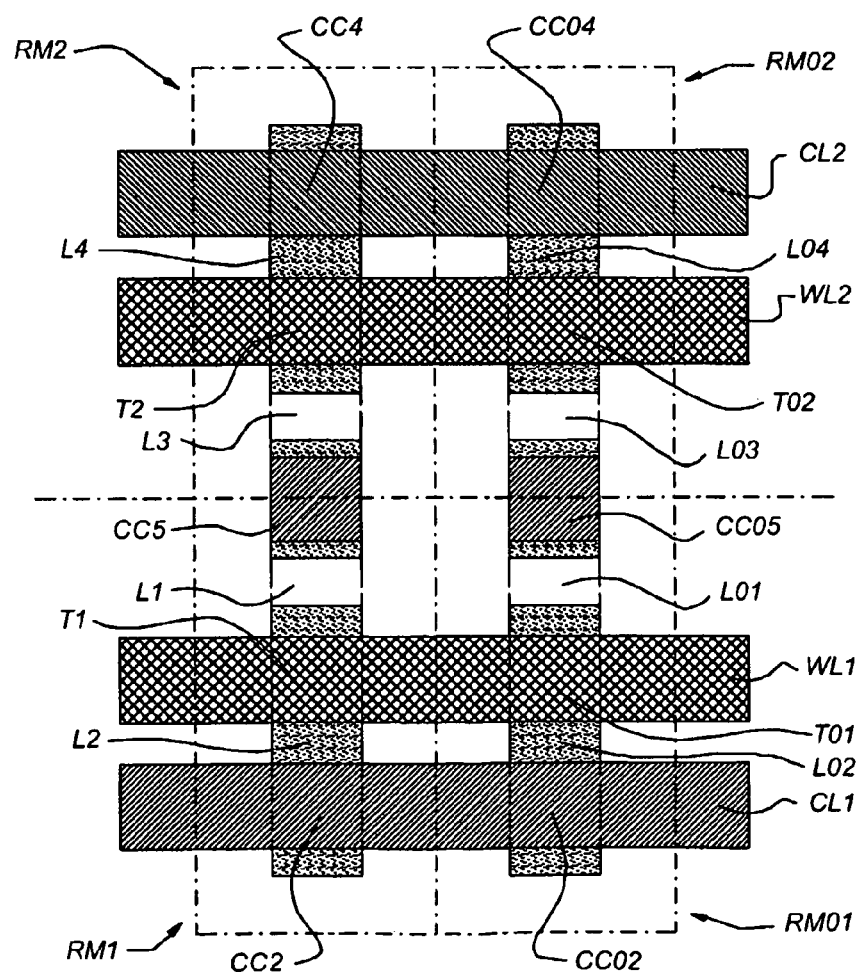
Figure 14A:
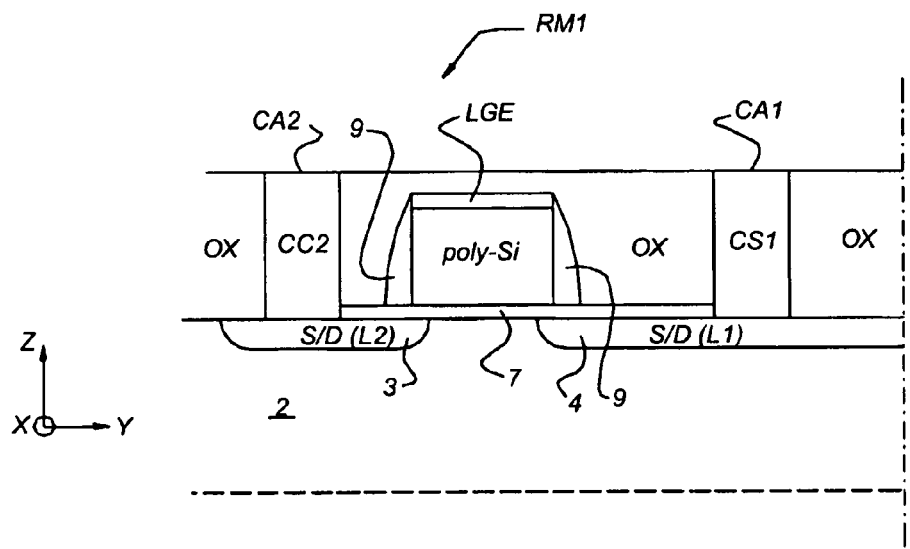
Figure 14B:
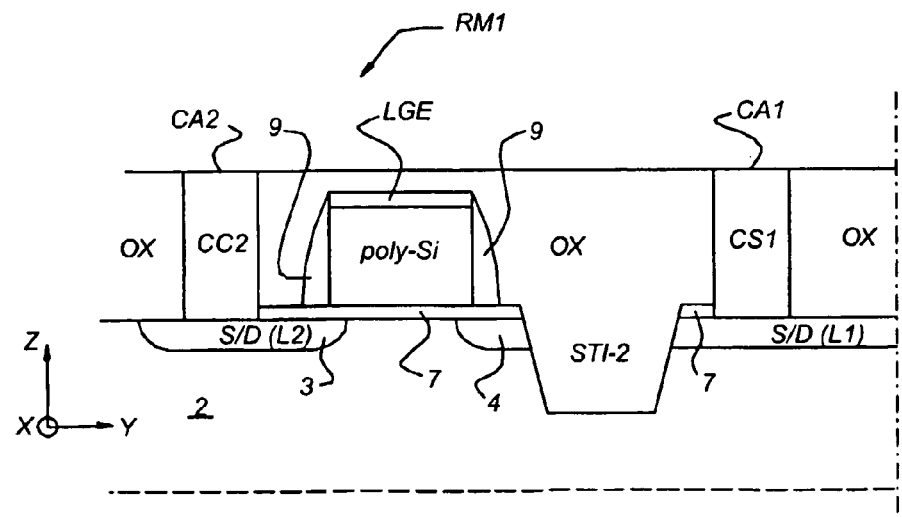
Figure 15:
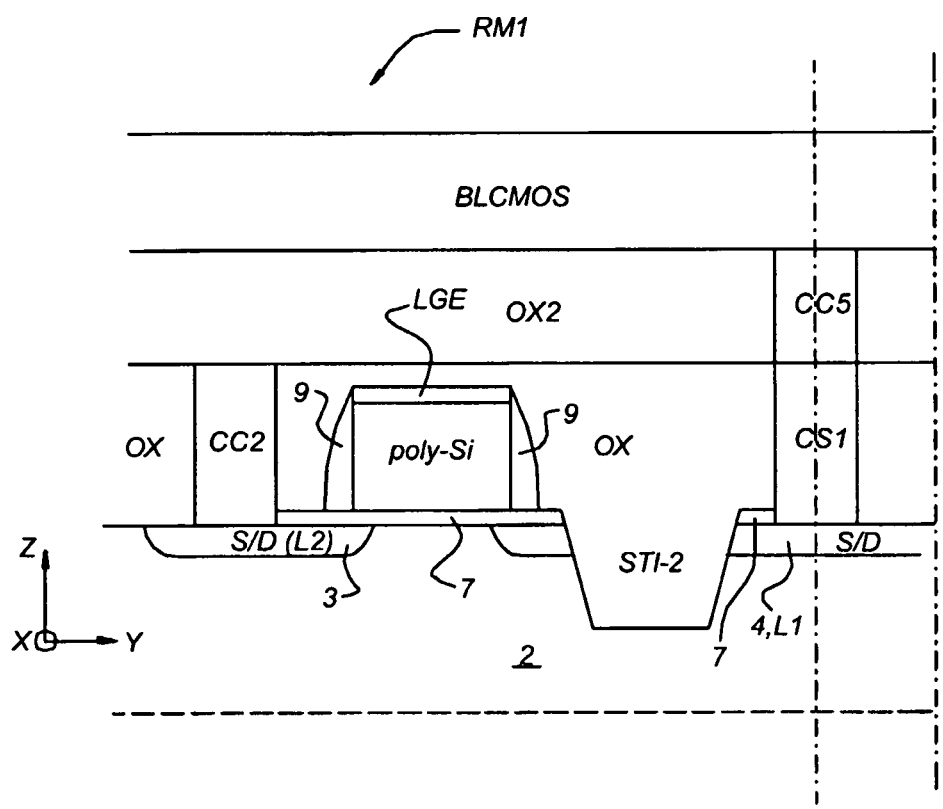

FIGS. 10*a* and 10*b* show a cross-sectional view of a ROM memory cell along line XA-XA and along line XB-XB, respectively, as shown in FIG. 9;

FIGS. 11*a* and 11*b* show the cross-sectional view of the ROM memory cell along line XA-XA for a contacted contact stud and a non-contacted contact stud, respectively;

FIG. 12 shows an electrical diagram of an arrangement of ROM memory cells in a second embodiment of the present invention;

FIG. 13 shows a plane view of a layout of ROM memory cells converted in accordance with the second embodiment of the present invention;

FIG. 14*a* shows a cross-sectional view of a ROM memory cell which comprises a connection over a first connection path L1;

FIG. 14*b* shows a cross-sectional view of a ROM memory cell which comprises no connection over a third connection path L3;

FIG. 15 shows a cross-sectional view of a ROM memory cell after definition of a second insulating layer and a bitline or 'metal-1' connection.

Figure 1:
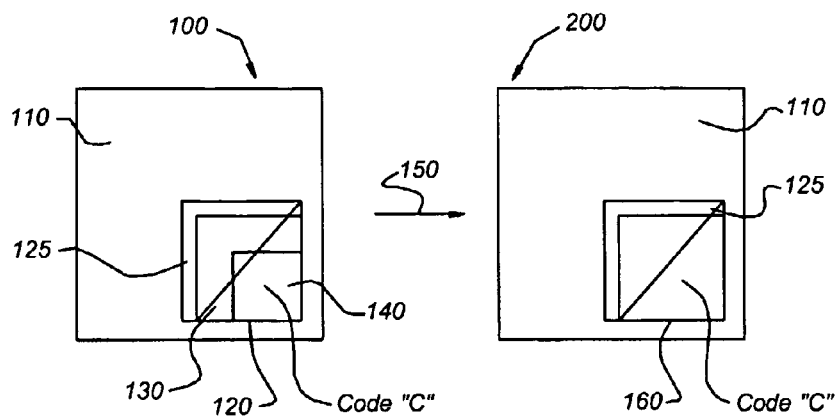
FIG. 1 shows schematically a Flash-to-ROM conversion of a SOC device.

FIG. 1 shows schematically a Flash-to-ROM conversion of a SOC device.

A first SOC device 100 comprises a device portion 110 as produced by baseline technology. Embedded in device portion 110 is a Flash section 120. Symbolically, a wiring scheme between device portion 110 and Flash section 120 is indicated by area 125. Flash memory section 120 comprises a peripheral circuitry 130 and a Flash memory portion 140. Peripheral circuitry 130 is connected on one side to the wiring scheme 125 of the device portion 110 and on another side to the Flash memory portion 140. The Flash memory portion 140 comprises a plurality of Flash memory cells and is arranged for holding program code C in the plurality of Flash memory cells. Program code C relates to a program which provides a functionality to the SOC device 100 during its operation.

The peripheral circuitry 130 comprises high voltage driver circuits arranged for performing writing, erasing and read operations of the Flash memory cells as known to persons skilled in the art.

The program code C is represented by bits which may have a '0' or '1' value. Each bit of the program code C can individually be stored in a single memory cell of the plurality of Flash memory cells in the Flash memory portion 140.

After the development stage for the SOC device 100 in which the program code C is engineered until a satisfactory function of the SOC device 100 is obtained, the program code C is consolidated and as such may be put into ROM. The Flash-to-ROM conversion as indicated by arrow 150 transforms the first SOC device 100 into a second SOC device 200.

According to the present invention, the second SOC device 200 comprises the device portion 110, identical to that in the first SOC device 100, and a ROM memory section 160. The ROM memory section 160 is connected to the device portion 110 by means of the wiring scheme 125, which is identical to the wiring scheme within the first SOC device 100. This condition allows for a Flash-to-ROM conversion without any change of the design of the SOC device.

The ROM memory section 160 comprises a plurality of ROM memory cells and is arranged for holding the consolidated program code C in the plurality of ROM memory cells.

The method 150 of the present invention is capable of replacing the Flash memory portion 140 by the ROM memory portion 160 without any change to the design of the SOC device. All electronic building blocks in the device portion 110 of the SOC device 100; 200 remain unaffected by method 150. Also, the wiring scheme 125 between the device portion 110 and the ROM cell memory section 160 is the same as the wiring scheme between device portion 100 and the Flash memory section 120.

Under the condition of no re-design, and since the electronic response (i.e., reading characteristics) of the bits in the cells of the ROM memory section 160 must be equivalent to the electronic response of the bits in the cells of the Flash memory section 120, the basic concept of the Flash-to-ROM conversion 150 includes a modification of both the Flash memory cells in the Flash memory portion 140 and the high voltage driver circuits in the peripheral circuitry 130 to baseline (i.e. CMOS) compatible components.

Figure 2:
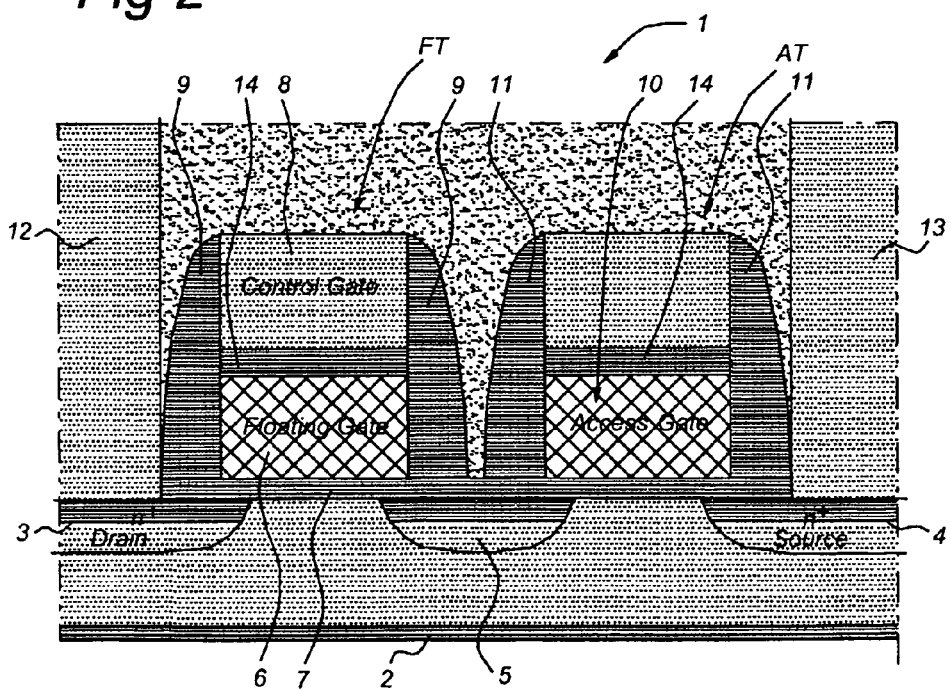
FIG. 2 shows schematically a cross-section of an exemplary planar 2T non-volatile memory cell.

The method of the present invention will hereinafter be described by means of an example of a conversion of a Flash memory arrangement as shown in FIG. 2.

FIG. 2 shows schematically a cross-section of an exemplary planar 2T non-volatile memory cell.

The depicted 2T non-volatile memory cell 1, also known as Flash cell, is of a planar type and comprises two distinct transistors, viz. a double-gate (or floating) transistor FT and a single-gate (or access) transistor AT.

On a p-type substrate 2', an n-type drain region 3, an n-type source region 4, and an n-type doped connecting region 5 are formed. On the surface, between drain region 3 and doped connecting region 5, a floating gate 6 is formed on a thin gate oxide 7. For Flash applications the thickness of the thin gate oxide 7 may be between 5 and 10 nm depending on the actual implementation. On top of the floating gate 6, a control gate 8 is formed. The control gate 8 is separated from the floating gate 6 by an intermediate dielectric layer 14, e.g., a silicon dioxide, silicon dioxide/silicon nitride or silicon dioxide/silicon nitride/silicon dioxide layer. Insulating side spacers 9 are formed on the sides of the stack of the floating gate 6 and the control gate 8. The floating gate 6 is arranged for controllably retaining charge and the control gate 8 is arranged for controlling reading, storing and erasing operations on the accompanying floating gate 6. Adjacent to this stack of floating gate 6 and control gate 8, between the doped connecting region 5 and the source region 4, an access gate 10 is formed on the thin gate oxide 7 on the surface of the substrate 2'. As shown here, the access transistor may comprise a stack similar to the stack of the floating gate 6, the isolating layer 14, the control gate 8, but the access gate may alternatively comprise a structure consisting of only a single layer. Also, the sidewalls of the access gate 10 are covered by an insulating spacer 1. The drain region 3 and the source region 4 are connected to a drain line and a source line, respectively, by their respective drain contact 12 and source contact 13. The access transistor AT is connected to the floating transistor FT by connecting region 5.

The single gate or access transistor AT is arranged to act as an access gate for selection of the double gate transistor FT.

Typically, Flash memory cells are arranged in a memory array 140 as shown in FIG. 1. In such an array two adjacent Flash memory cells may share a single source (or drain) and the contact to that source (or drain) element. Such a Flash memory provides a relatively high density of memory cells.

Figure 3:
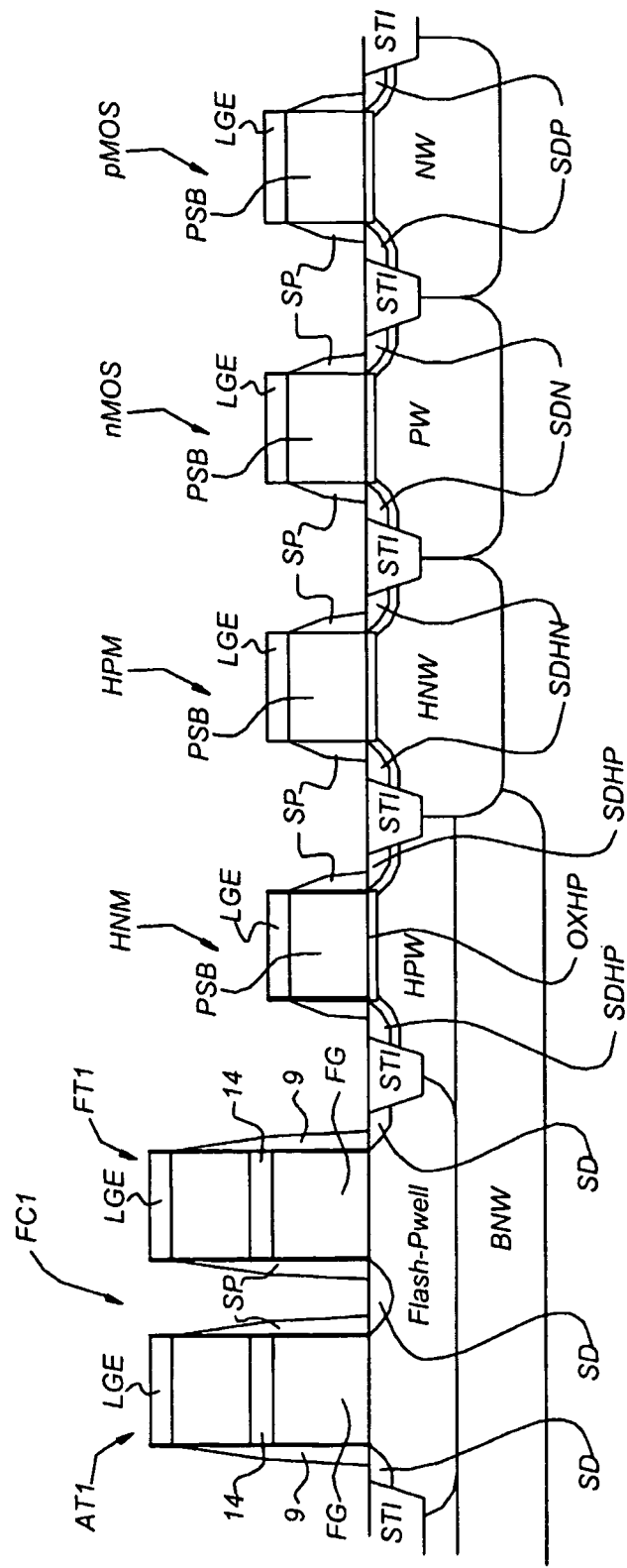
FIG. 3 shows schematically a cross-sectional view of the transistor types as used in the Flash memory section 120.

FIG. 3 shows schematically a cross-sectional view of the transistor types as used in the Flash memory section 120.

The transistor types comprise devices from both the peripheral circuitry 130 and the Flash memory portion 140.

On semiconductor substrate 1, a buried n-well region BNW is located. On the buried n-well region BNW a p-doped region Flash-Pwell (a.k.a. Flash-matrix) is located. On top of the p-doped region Flash-Pwell a Flash memory cell FC1; FC2; FC01; FC02 is located which comprises an access transistor AT and a floating transistor FT. Source/drain regions SD are provided for controlling conductance in the p-doped region Flash-Pwell below floating transistor FT and access transistor AT during operation. The p-doped region Flash-Pwell is demarcated by isolation in the form of shallow trench isolation STI. The Flash memory cell as shown in FIG. 3 is similar to the Flash memory cell as described with reference to FIG. 2.

Transistor devices from the peripheral circuitry 130 comprise high voltage (HV) devices such as HV-nMOSFET HNM, HV-pMOSFET HPM, and baseline (medium voltage MV) devices such as nMOSFET NMOS and pMOSFET pMOS.

Typically, HV devices are devices arranged for voltages of 10 V and above. Such devices have a gate oxide thickness in the order of 20 nm. MV devices are typically devices arranged for voltages of about 3 V. The gate oxide thickness for such medium voltage devices is 6-9 nm.

HV-nMOSFET HNM is located also on buried n-well region BNW: on top of the buried n-well region BNW a first p-well region HPW is located. On top of first p-well region HPW a stack comprising a first HV gate oxide OXHP, a poly-Si-layer PSB and a gate electrode layer LGE (for example, comprising silicide or metal) is located. The stack is demarcated by spacers SP. Next to the stack OXHP, PSB, LGE, source/drain regions SDHP are located in the first p-well region HPW. The HV-nMOSFET HNM is demarcated by isolation in the substrate in the form of shallow trench isolation STI. Due to the HV application the first HV gate oxide OXHN has a thickness compatible with HV applications, for example 20 nm.

HV-pMOSFET HPM is located on a first n-well region HNW. On top of first n-well region HNW a stack comprising a second HV gate oxide OXHP, a poly-Si layer PSB and a gate electrode layer LGE is located. The stack is demarcated by spacers SP. Next to the stack OXHP, PSB, LGE, source/drain regions SDHN are located in the first n-well region HNW. The HV-pMOSFET HPM is demarcated by isolation in the substrate in the form of shallow trench isolation STI. Due to the HV application the second HV gate oxide OXHP has a thickness compatible with HV applications, for example, 20 nm.

nMOSFET nMOS is located on a second p-well region PW. On top of second p-well region PW a stack comprising an n-MOS gate oxide OXN, a poly-Si layer PSB and a gate electrode layer LGE is located. The stack is demarcated by spacers SP. Next to the stack OXN, PSB, LGE, source/drain regions SDN are located in the second p-well region PW. The nMOSFET NMOS is demarcated by isolation in the substrate in the form of shallow trench isolation STI.

nMOSFET nMOS can be used in two modifications in the peripheral circuitry 130: a first NMOS type is used on a logic level, a second nMOS type is used on a medium voltage level. In the case of the logic level application, the n-MOS gate oxide OXN has a thickness of, for example, 3-5 nm. For MV applications the gate oxide OXN has a thickness of, for example, 6-9 nm.

pMOSFET pMOS is located on a second n-well region NW. On top of second n-well-region NW a stack comprising a p-MOS gate oxide OXP, a poly-Si layer PSB and a, gate electrode layer LGE is located. The stack is demarcated by spacers SP. Next to the stack OXP, PSB, LGE, source/drain regions SDP are located in the second n-well region NW. The pMOSFET pMOS is demarcated by isolation in the substrate in the form of shallow trench isolation STI.

pMOSFET pMOS can be used in two modifications in the peripheral circuitry 130: a first pMOS type is used on a logic level, a second type pMOS is used on a medium voltage level. In the case of the logic level application, the p-MOS gate oxide OXP has a thickness of, for example, 3-5 nm. For medium voltage applications the p-MOS gate oxide OXP has a thickness of, for example, 6-9 nm.

The source/drain regions SD; SDHP; SDHN; SDN; SDP each comprise a respective lightly-doped region FDD; nLDD; pLDD; nDD; pDD and a respective highly-doped region nHDD or pHDD, depending on the conductivity-type of the respective well region, i.e., either n- or p-type.

Source/drain regions SD of the Flash memory cell comprise a lightly-doped region FDD compatible for Flash memory devices and an n-type highly-doped region nHDD.

Source/drain regions SDHN of the HV-nMOSFET HNM comprise a lightly-doped region nLDD compatible for HV n-type devices and an n-type highly-doped region nHDD.

Source/drain regions SDHP of the HV-pMOSFET HPM comprise a lightly-doped region pLDD compatible for HV p-type devices and a p-type highly-doped region pHDD.

Source/drain regions SDN of the nMOSFET NMOS comprise a lightly-doped region nDD compatible for nMOSFET applications and an n-type highly-doped region nHDD.

Source/drain regions SDP of the pMOSFET pMOS comprise a lightly-doped region pDD compatible for pMOSFET applications and a p-type highly-doped region pHDD:

For reasons of clarity, the details on lightly-doped drain regions are not shown in FIG. 3.

Figure 4:
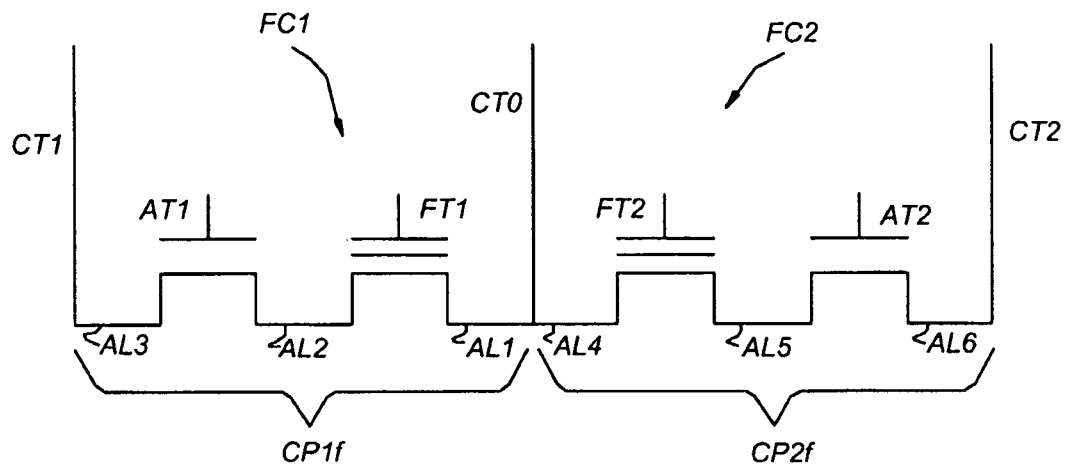
FIG. 4 shows an electrical diagram of an arrangement of 2T Flash memory cells to be converted to ROM memory cells.

FIG. 4 shows an electrical diagram of an arrangement of 2T Flash memory cells to be converted to ROM memory cells.

The arrangement comprises a first 2T Flash memory cell FC1 and a second 2T Flash memory cell FC2.

In this arrangement, the first 2T Flash memory cell FC1 and the second 2T Flash memory cell FC2 share a common (preferably drain) contact CT0, which is connected to the first 2T Flash memory cell FC1 and to the second 2T Flash memory cell FC2.

The first 2T Flash memory cell comprises a first floating gate transistor FT1 and a first access transistor AT1, with the first access transistor AT1 being connected to the first floating gate transistor FT1 by a second connection AL2 in between AT1 and FT1, similar to e.g., the connecting region 5 as shown in FIG. 2. Further, the first 2T Flash memory cell FC1 comprises a first contact (source) CT1, which is connected by means of a third connection AL3 to the first access transistor AT1 on a side facing away from the first floating gate transistor FT1. Also, a first connection AL1 is located between floating transistor FT1 and the common contact CT0.

The first, second, and third connections AL1, AL2, AL3 are provided as active conductive regions in the surface of the substrate. In series with the first access transistor AT1 and the first floating transistor FT1, the first, second and third connections AL1, AL2, AL3 form a conductive path CP1f of the first Flash memory cell FC1.

The second 2T Flash memory cell comprises a second floating gate transistor FT2 and a second access transistor AT2. The second access transistor AT2 is connected to the second floating gate transistor FT2 by a fifth connection AL5 in between AT2 and FT2, similar to e.g., the connecting region 5 as shown in FIG. 2.

Similarly to the first 2T Flash memory cell FC1, the second 2T Flash memory cell FC2 comprises a second contact (source) CT2, which is connected to the second access transistor AT2 on a side facing away from the second floating gate transistor FT2 by means of a sixth connection AL6. Also, a fourth connection AL4 is located between second floating transistor FT2 and the common contact CT0.

The fourth, fifth and sixth connections AL4, AL5 and AL6 are provided as active conductive regions in the surface of the substrate. In series with the second access transistor AT2 and the second floating transistor FT2, the fourth, fifth and sixth connections AL4, AL5, AL6 form a conductive path CP2f of the second Flash memory cell FC2.

Figure 5:
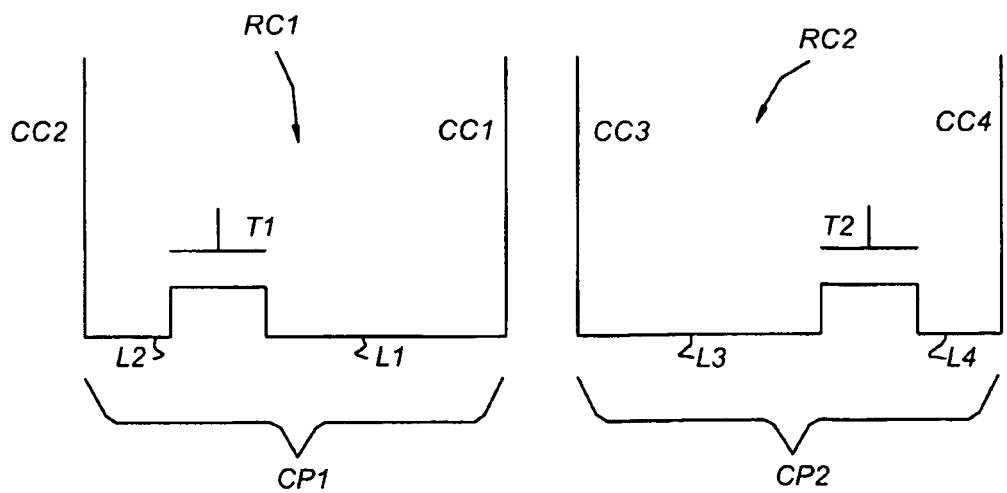
FIG. 5 shows an electrical diagram of an arrangement of ROM memory cells converted from Flash memory cells in a first embodiment of the present invention.

FIG. 5 shows an electrical diagram of an arrangement of ROM memory cells converted from the Flash memory cells of FIG. 4 in a first embodiment of the present invention.

The Flash-to-ROM conversion 150 converts the first and second 2T Flash memory cells FC1 and FC2 into a first ROM memory cell RC1 and a second ROM memory cell RC2, respectively.

By the conversion, the 2T Flash memory cell FC1; FC2 is converted into a single transistor (1T) ROM memory cell RC1; RC2. Both first and second ROM memory cells RC1, RC2 are fabricated in baseline technology, i.e., CMOS.

The first ROM memory cell RC1 comprises a first baseline transistor T1, (in CMOS a MOSFET), which on one side is connected by a connection L1 to a first cell contact CC1, for example a drain contact, and on the other side by a connection L2 to a second cell contact CC2, i.e., a source contact.

The connections L1, L2 are provided as active conductive regions in the surface of the substrate. In series with the first baseline transistor T1, the connections L1, L2 form a conductive path CP1 of the first ROM memory cell RC1 between first and second cell contacts CC1 and CC2.

The second ROM memory cell RC2 comprises a second baseline transistor T2, (in CMOS a MOSFET), which on one side is connected by a connection L3 to a third cell contact CC3, e.g. a source contact, and on the other side by a connection L4 to a fourth cell contact CC4, i.e., a drain contact.

The connections L3, L4 are provided as active conductive regions in the surface of the substrate. In series with the second baseline transistor T2, the connections L3, L4 form a conductive path CP2 of the second ROM memory cell RC2 between third and fourth cell contacts CC3 and CC4.

In the present invention, the common (drain) contact CT0 between the first and second 2T Flash memory cells FC1, FC2 is sacrificed and replaced by two cell contacts CC1, CC3 for the first ROM memory cell RC1 and the second ROM memory cell RC2, respectively.

To accommodate two separate cell contacts instead of one common contact, in the ROM memory cell arrangement a relatively larger area is needed than in the 2T Flash memory cell arrangement (provided the contact size in both cases is the same). So, some free area, in comparison with the area available in the 2T Flash memory cell arrangement, must be created: in each of the original Flash memory cells FC1; FC2 one of the transistors AT1, FT1; AT2, FT2 can advantageously be eliminated to allow for two cell contacts in the arrangement of ROM memory cells RC1; RC2.

Note that given the objective to maintain the same layout of the device portion 110 and the wiring scheme 125 of the first SOC device 100, and to keep changes to masks (to convert first SOC device 100 to second SOC device 200) to a minimum, the location of a transistor T1; T2 of the ROM memory cell RC1; RC2 in the ROM memory area 160 is substantially identical to the location of the access transistor AT1; AT2 of the corresponding 2T Flash memory cell FC1; FC2.

It is noted here that in the conversion the access transistor of the Flash memory cell is preferably designated as the single gate transistor of the ROM memory cell, i.e., at the location of the access transistor the single gate transistor is formed. However, it is conceivable that, instead, the floating transistor is designated as the single gate transistor and the access transistor is eliminated, or in other words that at the location of the floating transistor the single gate transistor is formed. This alternative may be used in embodiments where the arrangement of memory cells in the Flash memory section of the SOC device favors this way of conversion. Also the overall amount of mask manipulation needed in both cases may influence which option (i.e. to eliminate either the floating transistor or the access transistor, and designate the location of the remaining transistor as the location of the single gate transistor of the ROM memory cell) is preferred.

Figure 6:
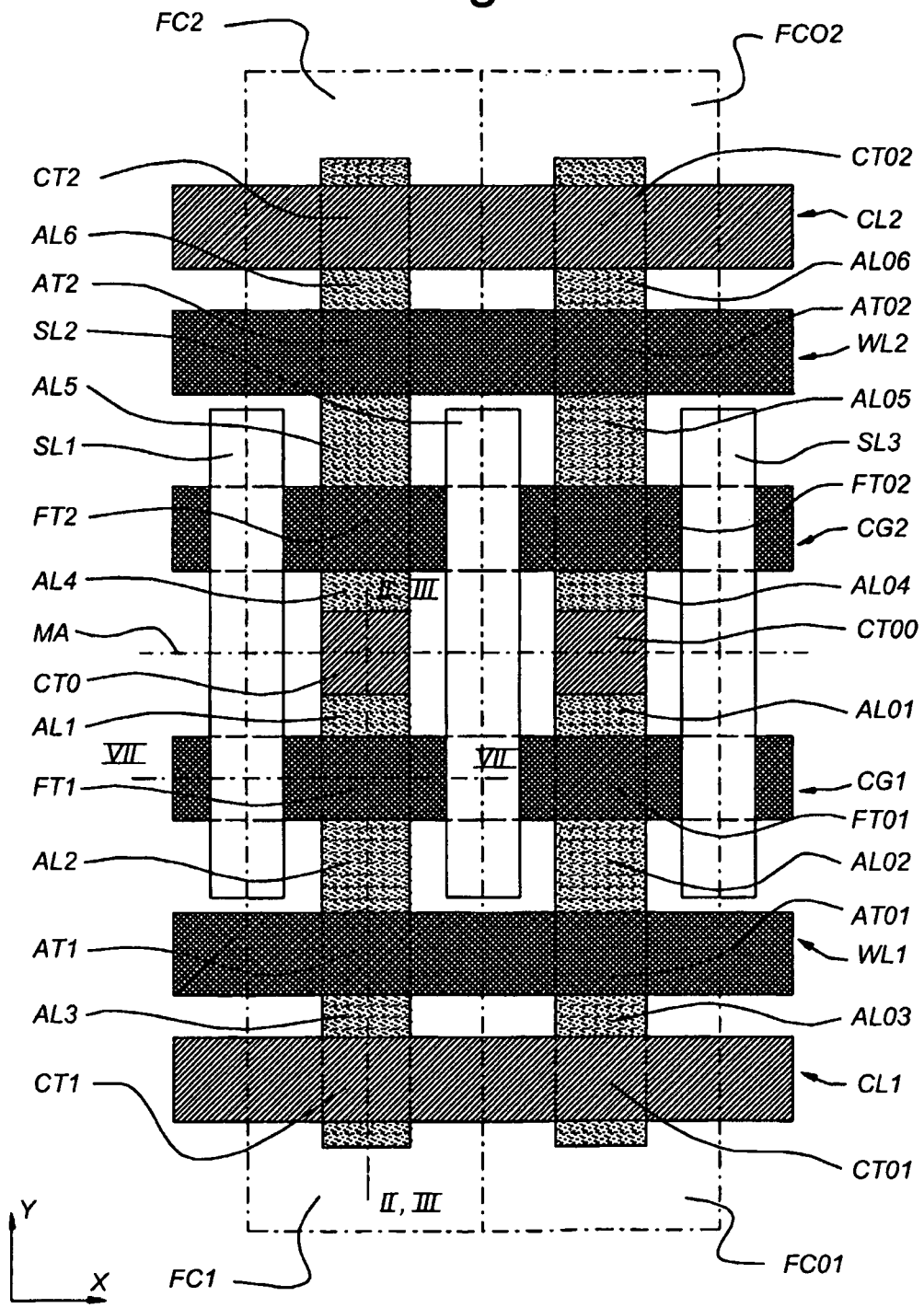
FIG. 6 shows a plane view of a layout of Flash memory cells to be converted.

FIG. 6 shows a plane view of a layout of Flash memory cells to be converted.

The Flash memory cells FC1, FC2 shown in FIG. 5 have been described above with reference to FIGS. 2 and 4. In FIG. 6 entities with the same reference number refer to identical entities as shown in the preceding Figures.

First Flash memory cell FC1 is indicated by a rectangular area within dotted lines. Second Flash memory cell FC2 is mirrored relative to the first Flash memory cell FC1 across a mirror axis MA, positioned in the center of the common contact CT0, parallel to a first direction X, and is assumed to take up a similar area as first Flash memory cell FC1.

First and second Flash memory cell FC1 and FC2 have conductive paths CP1f, CP2f comprising the conductive regions of first, second and third connections AL1, AL2, AL3 and of fourth, fifth, and sixth connections AL4, AL5, AL6, respectively, which extend in a second direction Y which is substantially perpendicular to the first direction X.

A first contact line CL1 extends in the first direction X and crosses the conductive path of the first Flash memory cell FC1. At the intersection of the first contact line CL1 and the conductive path CP1f of the first Flash memory cell FC1, the first contact CT1 is arranged.

A first word line WL1 is arranged parallel to the first contact line CL1 and crosses the first Flash memory cell FC over the first access gate transistor AT1 to form an access gate contact at the crossing point. First word line WL1 preferably consists of poly-Si.

A first control gate line GL1 is arranged parallel to the first contact line CL1 and the first word line WL1, and crosses the first Flash memory cell FC over the first floating gate FG to form the first floating gate transistor FT1 at the crossing point. First control gate line GL1 preferably consists of poly-Si.

Figure 7:
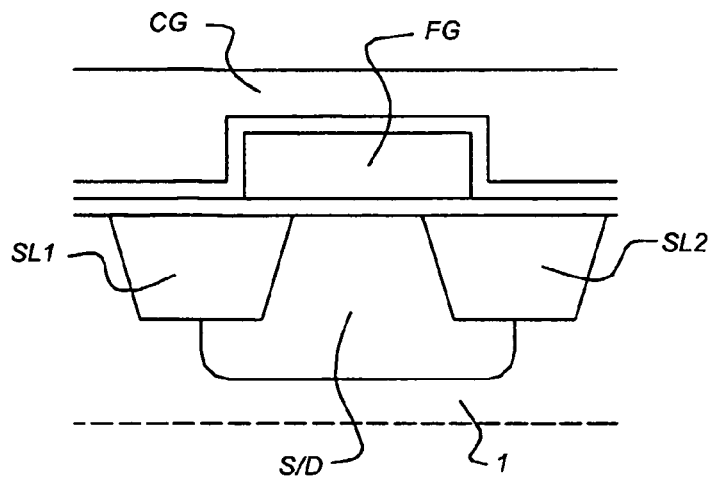
FIG. 7 shows a cross-sectional view of a Flash memory cell along a line VII-VII as shown in FIG. 6.

Note that the floating gate is made up of a first poly-Si line under the first control gate line CG1, but to ensure isolation of the Flash memory cell from an adjacent Flash memory cell on the same control gate line CG1 (e.g. Flash memory cell FC01), the first poly-Si line is interrupted in between the first Flash memory cell FC1 and the adjacent Flash memory cell by means of an isolation slit SL1, SL2, SL3. In FIG. 7, a cross-sectional view along line VII-VII will be shown to explain the structure of the Flash memory cell in more detail.

Due to the mirror-symmetry about mirror axis MA, a second contact line CL2, a second word line WL2, a second poly-Si line and a second control gate line CG2 are arranged over second Flash memory cell FC2 and its adjacent Flash memory cells, e.g., Flash memory cell FC02. Also the slits SL1, SL2, SL3 extend in the second direction Y over the mirror axis MA to ensure interruption of the second poly-Si line.

FIG. 7 shows a cross-sectional view of a Flash memory cell along the line VII-VII of FIG. 6.

On the substrate 2', the gate oxide layer 7 is present. In the substrate 1, two isolation regions in the form of shallow trenches SL1, SL2 are located. On top of the gate oxide 7, the floating gate region FG is located substantially in between the two shallow trenches SL1, SL2. On top of the floating gate region FG, the intermediate dielectric layer 14 is present. On top of the intermediate dielectric layer 14, the control gate layer CG is located, of which the surface in this case is planarised.

Next, the mask manipulation scheme is explained.

As explained earlier with reference to FIG. 4, the objective is to have no re-design between first SOC devices 100 with Flash memory and second SOC devices 200 with ROM memory, which implicates that in the second SOC device 200 the same layout of the device portion 110 and the wiring scheme 125 is maintained as in the first SOC device 100, and that changes to masks (to convert first SOC device 100 to second SOC device 200 without affecting the design) are kept to a minimum. This also implicates that the location of a transistor T1; T2 of the ROM memory cell RC1; RC2 in the ROM memory area 160 must be substantially identical to the location of the access transistor AT1; AT2 of the corresponding 2T Flash memory cell FC1; FC2.

Thus, the present invention provides a mask manipulation scheme, which converts Flash to ROM, without substantially affecting the design (layout and wiring scheme) of the second SOC device 200 compared to that of the first SOC device 100. This mask manipulation scheme comprises at least two actions to be performed:

In the first place, a conversion of the actual Flash memory cell into a CMOS single gate transistor is carried out. Secondly, a conversion of (HV, MV) devices in the peripheral circuitry 130, as shown in FIG. 3, must be performed to low voltage (baseline) or medium voltage CMOS devices.

As explained below these at least two actions require adaptations and modifications of the layout of one or more of the masks used for baseline technology (baseline masks). Further, the second SOC device 200 will be manufactured by the modified baseline masks (modified in accordance with the method 150 for conversion) without a need to use masks of the non volatile technology (non-volatile technology masks) as were used in the manufacture of the first SOC device 100.

Figure 8:
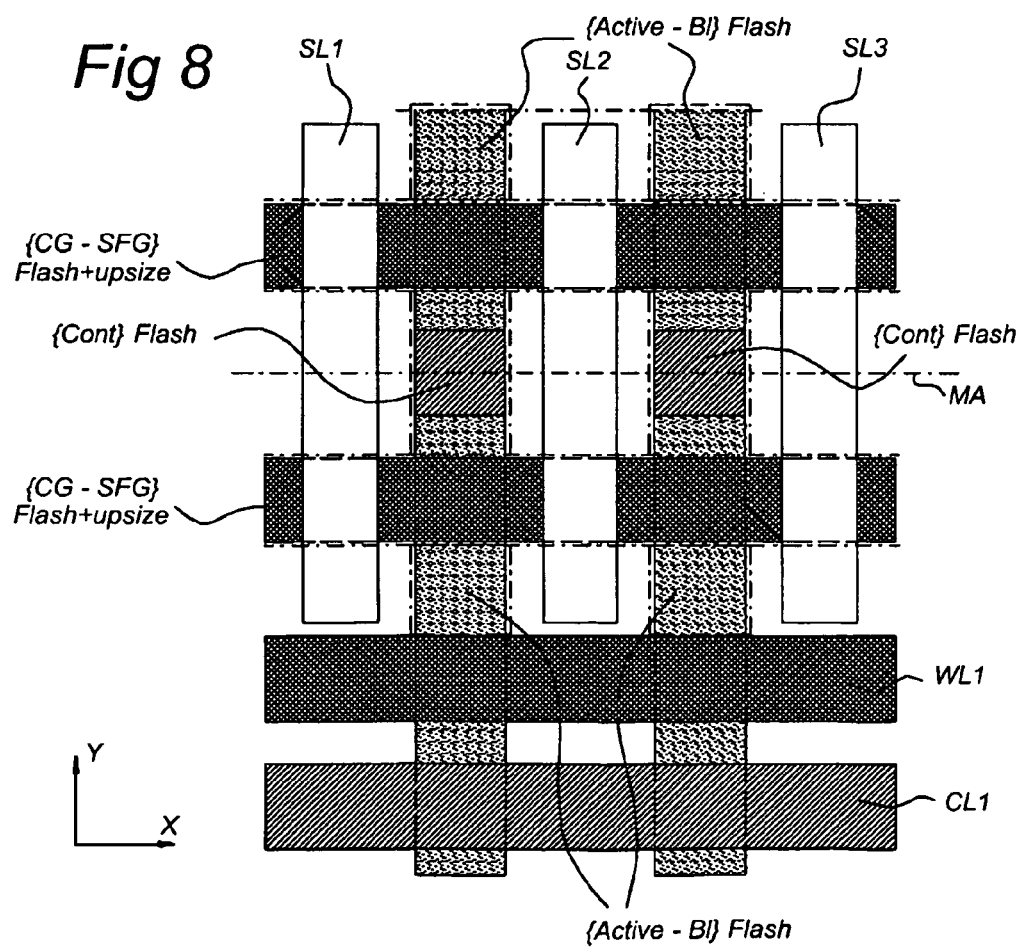
FIG. 8 shows a plane view of some mask areas in the layout of Flash memory cells to be converted.

FIG. 8 shows a plane view of some mask areas in the layout of Flash memory cells to be converted.

A) In the Flash memory cell arrangement FC1, FC2; FC01, FC02, a mask for the active (doped) area, denoted {Active}, is changed:

First an area {BLCONT} is defined that comprises the area of floating transistors plus the area of the contact CT0.

Logically, on Flash the area of floating transistors as denoted by dotted lines is a first mask area {CG_

SFG$\}_{Flash}$ which equals that part of the control gate line mask $\{CG\}_{Flash}$ which covers the area of the slits SL1, SL2, SL3 adjacent to the floating gates FG1, FG2 plus the area of CG that covers the area of the floating gates.

Further, the mask area $\{CONT\}_{Flash}$ for the (bitline) common contacts CT0, CT00 is indicated.

Area {BLCONT} is the BLCONT (bitline contacting) closest to $\{CG\_SFG\}_{Flash}$ and can be defined by {CONT} touching {CG_SFG} after a degree of upsizing (i.e., the area is somewhat enlarged, by upsizing the length and width of the area, for example by 4% of the area).

$$\{BLCONT\}=\{CG\_SFG\}_{Flash+upsize} \text{ AND } \{CONT\} \quad (1)$$

Effectively, on the mask layout for the conductive path CP1f of the first Flash memory cell FC1, the active area remains the same, except that the active area, covered by {BLCONT}, is eliminated from the active area mask. Similar operations are performed on the active area mask for further active area portions that relate to the conductive paths of other Flash memory cells, e.g., second Flash memory cell FC2.

Logically, the active area mask is defined as:

$$\{Active\}_{CMOS}=\{Active\}_{Flash} \text{ AND (NOT } \{BLCONT\}_{Flash}) \quad (2),$$

where index CMOS indicates the mask to be used for the SOC device 200 comprising ROM memory cells, and index Flash indicates the mask used for the SOC device 100 comprising Flash memory cells.

B) A mask for poly-Si deposition, denoted {Poly} is changed as follows:

The poly-Si mask for CMOS $\{Poly\}_{CMOS}$ is equal to the original poly-Si mask for Flash $\{Poly\}_{Flash}$ extended with the control gate lines mask $\{CG\}_{Flash}$ but without a first poly mask area $\{CG\_SFG\}_{Flash}$ which equals the control gate line mask $\{CG\}_{Flash}$ covering an area $\{SFG\}_{Flash}$ of the slit SL1, SL2, SL3 adjacent to the floating gates FG1, FG2. Other parts of the {Poly} mask are left unaffected.

The mask {Poly} for poly-Si is thus defined as:

$$\{Poly\}_{CMOS}=\{Poly\}_{Flash} \text{ AND} \{CG\}_{Flash} \text{ AND (NOT}\{CG\_SFG\}_{Flash+upsize}) \quad (3)$$

C) A contact mask, denoted {CONT}, is modified to comprise contact locations for each ROM memory cell. Initially, the {CONT} mask is reduced to eliminate the Flash contacts:

$$\{CONT\}_{CMOS}=\{CONT\}_{Flash} \text{ AND (NOT } \{BLCONT\}) \quad (4)$$

The contacts may be formed on top of the contact studs. In that case, the local interconnect LIL is arranged as contact studs in the first layer in which the single gate transistor is located.

A mask for local interconnect (LIL), denoted as {LIL}, is then modified in accordance with the location of the contacts for CMOS which are located at the location of the former floating transistors. The location of the contacts for Flash are eliminated from the mask.

Other parts of the {LIL} mask are left unaffected.

Basically, the locations for LIL as defined by the $\{LIL\}_{CMOS}$ mask comprise the locations of the floating transistors as present in the Flash memory cell arrangement (of FIG. 8).

Next, when contact studs are to be used, the contacts are to be made on top of the contact studs as defined by the $\{LIL\}_{CMOS}$ mask.

By adapting the $\{LIL\}_{CMOS}$ mask by the actual program code C by one bit ('0' or '1') for each ROM memory cell, functional contacts are formed only on ROM memory cells being defined as '1' and not on ROM memory cells being defined as '0'. Basically, this relates to a logical 'AND' operation for each contact on the first LIL area mask to create contact mask for CMOS with programming code $\{CONT\}_{CMOS+code}$:

$$\{CONT\}_{CMOS+Code}=\{LIL\}_{CMOS} \text{ AND } \{ROM \text{ code at } \{CG\_SFG\}_{Flash+upsize} \times \{Active\}_{CMOS}\}\} \quad (5)$$

Persons skilled in the art will appreciate that the wiring logic could be reversed (i.e., no contact on a '1' bit, contact on '0' bit).

Note that when no contact studs are to be used the contact mask for CMOS with programming code $\{CONT\}_{CMOS+Code}$ is obtained from the contact mask $\{CONT\}_{CMOS}$ of eq. 4 and the (ROM code at $\{CG\_SFG\}_{Flash+upsize} \times \{Active\}_{CMOS}\}$) as follows:

$$\{CONT\}_{CMOS+Code}=\{CONT\}_{CMOS} \text{ AND } \{ROM \text{ code at } \{CG\_SFG\}_{Flash+upsize} \times \{Active\}_{CMOS}\}\} \quad (6)$$

E) Additional mask manipulation is needed for the conversion of the devices HPM, HNM, nMOS, pMOS in the peripheral circuitry 130. Basically, p-channel devices HPM, pMOS will be converted into baseline CMOS p-channel devices (p-channel MOSFET). N-channel devices HNM, nMOS will be converted into baseline CMOS n-channel devices (n-channel MOSFET). Also, since the gate-oxide for HV devices is thicker than for logic-level devices, also a conversion of the gate-oxide mask is needed to define the proper gate-oxide areas for the devices of the peripheral circuitry that are to be converted.

On CMOS, only standard wells are to be used on the masks that define the devices HPM, HNM, nMOS, pMOS in the peripheral circuitry 130.

On p-type substrates: an n-well mask $\{Nwell\}_{CMOS}$ equals the n-well mask $\{Nwell\}_{Flash}$ for Flash HV devices which covers the n-well regions NW, and at the same time the mask $\{HNW\}_{Flash}$ which covers the HNW regions in Flash memory cells:

$$\{Nwell\}_{CMOS}=\{Nwell\}_{Flash} \text{ AND } \{HNW\}_{Flash} \quad (7)$$

In CMOS on p-type substrate, the p-well region is the complement of the n-doped region. A p-well mask $\{Pwell\}_{CMOS}$ in this case equals the area other than the area defined by n-well mask $\{Nwell\}_{CMOS}$:

$$\{Pwell\}_{CMOS}=\text{NOT } \{Nwell\}_{CMOS} \quad (8)$$

Further, the gate oxides OXHP, OXHN in the HV devices HPM, HNM are to be reduced to a thickness compatible with lower (medium) voltage CMOS devices. Thus, the gate oxide mask {GO2} for HV devices is changed in such a way that the relevant areas, which had a thickness of 20 nm in Flash, are to have a thickness of 6-9 nm in CMOS.

Furthermore, it is required to change the gate oxide areas OXN, OXP for LMOS and pMOS, respectively.

Also, the lightly-doped mask/masks generally denoted as {LDD} are adapted, since the electronic characteristics of the HV and MV devices in the peripheral circuitry 130 are changed. A skilled person will know how to modify the lightly-doped mask/masks for this purpose.

Finally, the n-type LDD implantation mask/masks {LDD} for transistors in the Flash memory cell portion 140 needs/need to be adapted as follows: n-LDD implantation is needed in the area of the tunneling oxide of the p-doped region Flash_Pwell which at the same time covers the n+doped regions BNW. Further, the LDD implantation mask/masks {LDD} is/are unaffected.

Due to the mask manipulation as described above, the masks relating to the non-volatile technology for making Flash memory cells can be omitted from the manufacturing process of the second semiconductor device 200. Only masks for baseline technology i.e., CMOS, are used for manufacturing the second semiconductor device 200.

The basic manipulation of the masks thus involves the elimination of the common contact CT0; CT00 in the Flash memory cell arrangement and the replacement of it by two separate contacts CC1; CC3 for two ROM memory cells RC1, RC2; RC01, RC02. Due to the possibility to remove one transistor from the 2T cell, a CMOS ROM memory cell arrangement 160 can still be achieved within the same area as occupied by the Flash memory portion 140.

FIG. 9 shows a plane view of a layout of ROM memory cells converted from the Flash memory cells of FIG. 6, in accordance with a first embodiment of the present invention.

In FIG. 9 an arrangement of four ROM memory cell areas RC1, RC2, RC01, RC02 on the substrate 2 of second SOC semiconductor device 200 is shown, which are each corresponding to the electrical diagram of a ROM memory cell as shown in FIG. 5.

The ROM memory cell arrangement is shown after the processing stage at which the LIL mask $\{LIL\}_{CMOS}$ has been applied.

First ROM memory cell RC1 comprises the conductive path CP1 between first and second cell contacts CC1 and CC2, extending in the second direction Y. At second contact CC2, the conductive path CP1 is connected to the first contact line CL1, which extends in the first direction X. Parallel to first contact line CL1 extends first word line WL1, which connects to the single gate transistor T1. Further, on the conductive path CP1 of the first ROM memory cell RC1, a first contact stud CS1 may be located.

The second ROM memory cell RC2 is mirrored relative to the first ROM memory cell RC1 along the mirror axis MA.

Second ROM memory cell RC2 comprises the conductive path CP2 between third and fourth cell contacts CC3 and CC4. At fourth contact CC4, the conductive path CP2 is connected to the second contact line CL2, which extends in the first direction X. Parallel to second contact line CL2 extends second word line WL2, which connects to the second single gate transistor T2. Further, on the conductive path CP2 of the second ROM memory cell RC2, a third contact stud CS3 may be located.

Similarly, ROM memory cell RC01 comprises a conductive path (of conductive regions in series with RC01's baseline transistor T01) between its cell contacts CC01 and CC02. At cell contact CC02, the conductive path is connected to the first contact line CL1. The first word line WL1 connects to the single gate transistor T01 of ROM memory cell RC00. Further, on RC01's conductive path a contact stud CS01 is located.

Also, ROM memory cell RC02 comprises a conductive path (of conductive regions in series with RC02's baseline transistor T02) between its cell contacts CC03 and CC04. At contact CC04, the conductive path is connected to the second contact line CL2, which extends in the first direction X. Parallel to second contact line CL2 extends second word line WL2, which connects to the second single gate transistor T02 of ROM memory cell RC02. Further, on RC02's conductive path a fourth contact stud CS02 may be located.

The formation of contact studs CS1, CS2, CS01, CS02 and/or contacts at that location will be discussed in more detail below.

It is to be noted that, due to the mask manipulation, the area of the contact CT0; CT00 as present in the Flash memory cell arrangement is now void and, instead, the mask manipulation scheme is arranged such that a field oxide (shallow trench isolation, STI) is formed in that region. The field oxide or STI formation can be combined with the process of masking and formation of the slits SL1, SL2, SL3.

FIGS. 10a and 10b show a cross-sectional view of the ROM memory cell along line XA-XA and along line XB-XB, respectively, as shown in FIG. 9.

The ROM memory cell RC1 comprises the single gate transistor T1, the contact stud CS1 and the contact CC2.

On top of gate oxide 7, transistor T1 comprises a poly-Si body within spacers 9. On-top of the poly-Si body a gate electrode layer LGE such as a silicide layer may be located. The gate electrode layer is arranged for enhancing the conductivity of the poly-Si body and to improve the gate electrode function of the transistor T1.

Within the p-type substrate 2, the n-type doped regions 3 and 4 are arranged as source/drain regions which each extend along the surface and slightly under the poly-Si body. N-type doped region 3 is connected to contact CC2. N-type doped region 4 is connected to contact stud CS1. Further, the ROM memory cell comprises a planarised insulating layer OX which covers the transistor T1. Contact area CA1 at the top of contact stud CS1 and contact area CA2 of contact CC2 extend substantially parallel to the top of the planarised insulating layer OX.

FIG. 10b shows the ROM memory cell along line XB-XB as shown in FIG. 9. The poly-Si body of the transistor T1 is located in between two isolation trenches (shallow trench isolation ST1) as provided by slits SL1, SL2.

FIGS. 11a and 11b show the cross-sectional view of the ROM memory cell along line XA-XA for a contacted contact stud and a non-contacted contact stud, respectively.

The ROM memory cell in FIGS. 11a and 11b are arranged identical to the ROM memory cell as shown in the cross-sectional view of FIG. 10a, and are not described in detail here.

In FIG. 11a, on top of the insulating layer OX, the contact CC2 and the contact stud CS1, a second insulating layer OX2 is located which covers the insulating layer OX, the contact CC2 and the contact stud CS1. In the second insulating layer OX2 a contact hole CH1 is present. In contact hole CH1 a (metal) contact CC1 is provided for making electrical contact. On top of the second insulating layer OX2 a bitline BLcmos is provided for contacting the ROM memory cell RC1. The bitline BLcmos extends in the X-direction. Bitline BLcmos is in contact with the contact CC1 and the contact stud CS1 for connecting to the transistor T1. The contact CC2 in this case is arranged as a word line WL which extends in the Y direction which is perpendicular to the plane of the drawing.

In FIG. 11b, the ROM memory cell RC01 is shown. On top of the insulating layer OX, the contact CC2 and the contact stud CS1, a second insulating layer OX2 is located which covers the insulating layer OX, the contact CC2 and the contact stud CS1. On top of the second insulating layer OX2, the bitline BLcmos is arranged. In ROM memory cell RC01 no contact hole is provided in the second insulating layer OX2, thus no functional contact between the bitline BLcmos and the transistor T01 of ROM memory cell RC01 is established.

As explained earlier, the program code C is defined as contact holes in the second insulating layer OX2 for those ROM memory cells which must store a '1' bit. (Or in the reverse mode a '0' bit). ROM memory cell RC1 denotes a memory cell with a '1' bit, ROM memory cell RC01 a memory cell with a '0' bit.

It is noted that the programming is carried out here at a contact level below Metal-1. To those skilled in the art it is obvious that this can be done also with contacts between higher positioned metal layers. In this case the metal layers need to be manipulated as well.

FIG. 12 shows an electrical diagram of an arrangement of ROM memory cells converted from the Flash memory cells of FIG. 4, in a second embodiment of the present invention.

The Flash-to-ROM conversion 150 converts the first and second 2T Flash memory cells FC1 and FC2 into a third ROM memory cell RM1 and a fourth ROM memory cell RM2, respectively.

By the conversion the 2T Flash memory cell FC1; FC2 is converted into a single transistor (1T) ROM memory cell RM1; RM2. Both third and fourth ROM memory cells RC1, RC2 are fabricated in baseline technology, i.e., CMOS.

The third ROM memory cell RM1 comprises a first baseline transistor T1, (in CMOS a MOSFET), which on one side is connected to a common cell contact CC5, for example a drain contact, and on the other side to a second cell contact CC2, for example a source contact. In third ROM memory cell RM1, a first connection path L1 is present between source CC2 and one side of transistor T1, and a second connection path L2 is present between the other side of the transistor T1 and the common (drain) contact CC5.

The fourth ROM memory cell RM2 comprises a second baseline transistor T2, (in CMOS a MOSFET), which on one side is connected to the common cell contact CC5, and on the other side to a fourth cell contact CC4, i.e., a source contact. In fourth ROM memory cell RM1, a third connection path L3 is present between source CC4 and one side of transistor T2, and a fourth connection path L4 is present between the other side of the transistor T2 and the common drain contact CC5.

The connection paths L1, L2, L3, L4 will be described in more detail with reference to FIG. 13.

In the present invention, the common contact CC5 between the first and second 2T Flash memory cells FC1, FC2 is maintained as the common contact CC5 for the third ROM memory cell RM1 and the fourth ROM memory cell RM2, respectively.

Since in each ROM memory cell RM1; RM2 only one transistor T1; T2 is present within the same area as formerly occupied by the two transistors FT1, AT1; FT2, AT2 of the Flash memory cell FC1; FC2, the ROM memory cell arrangement is somewhat less dense than the 2T Flash memory cell arrangement (provided the contact size in both cases is the same). Some free area is available as compared to the area in the 2T Flash memory cell arrangement.

Given the objective to maintain the same layout of the device portion 10 and the wiring scheme 125 of the first SOC device 100, and to keep changes to masks (to convert first SOC device 100 to second SOC device 200) to a minimum, the location of the transistor T1; T2 of the ROM memory cell RM1; RM2 in the ROM memory area 160 is preferably identical to the location of the access transistor AT1; AT2 of the corresponding 2T Flash memory cell FC1; FC2, while the floating transistor FT1; FT2 has been eliminated.

In this second embodiment of the present invention, the program code C, which is to be stored in the ROM memory cell arrangement, can be defined on the bit level by the presence of a conducting connection (in Active) between source contact and drain contact over the transistor in a ROM memory cell. A bit '1' can for example be defined by a ROM cell which is in a conducting state, and a bit '0' is then defined by a non-conducting state.

The conducting state can be defined as a state in which a current is above a given threshold value, the non-conducting state is identical to a state with a current below that threshold value. As is known to persons skilled in the art, the presence of bits may also be presented by a reversed conduction scheme: '0' for conducting state and '1' for non-conducting state.

Also the conducting state may be related to a voltage level measured over the transistor, with the voltage level being above or below a threshold value for determining a corresponding bit value.

In a ROM memory cell e.g., cell RM1, the connection paths L1 and/or L2 may be used for programming the cell. By omitting the connection path L1 and/or L2, no conduction will be possible in the ROM memory cell RM1: it cannot be brought into the conducting state. If both connection paths L1, L2 are present, it is possible to have conduction in the ROM memory cell. Thus, programming a ROM memory cell may be carried out by defining for that cell the number of connection paths in dependence on the bit value to be stored. Thus, for a conducting ROM memory cell two connection paths must be defined, for a non-conducting ROM memory cell either zero or one connection path may be defined.

FIG. 13 shows a plane view of a layout of ROM memory cells converted from the Flash memory cells of FIG. 6, in accordance with a first embodiment of the present invention.

In FIG. 13 an arrangement of four ROM memory cell areas RM1, RM2, RM01, RM02 is shown, which, in pairs, correspond to the electrical diagram of the third and fourth ROM memory cell RM1, RM2 as shown in FIG. 12.

ROM memory cell RM1 comprises the first connection path L1 and the second connection path L2.

First connection path L1 is located between the common contact CC5 and transistor T1. Second connection path L2 is located between transistor T1 and contact CC2, bitline BL1 extending in the second direction Y. At second contact CC2 the second connection path L2 is connected to the first contact line CL1, which extends in the first direction X. Parallel to first contact line CL1 extends first word line WL1, which connects to the single gate transistor T1.

Connection path L1, in this embryonic stage of the ROM memory cell RM1, is shown as a vacant space of the surface of the substrate 2. Second connection path L2 is defined in the ROM memory cell RM1 by means of a doped active area between contact CC2 and transistor T1.

Similarly, ROM memory cell RM2 comprises the third connection path L3 between common contact CC5 and transistor T2, and the fourth connection path L4 between transistor T2 and contact CC4. At contact CC4 the fourth connection path L4 is connected to the second contact line CL2, which extends in the first direction X. Parallel to second contact line CL2 extends second word line WL2, which connects to the single gate transistor T2. Third connection path L3 is still vacant on the surface of the substrate, while the fourth connection path L4 is defined by means of a doped active area.

ROM memory cells RM01 and RM02 are constructed similarly to RM1 and RM2, respectively, and are not discussed here in detail.

Note that in case no connection over a connection path is defined, in this example for L3, the mask manipulation scheme is such that at the vacant location a shallow trench isolation region is defined, similar to the method of the first embodiment: where each location which becomes vacant by the elimination of the common contact CT0 in each Flash memory cell FC1 is defined as a shallow trench isolation region.

The mask manipulation in this second embodiment is defined to eliminate an area of the Flash memory cell arrangement which equals the area of the floating-transistors FT1, FT2, FT01, FT02 and possibly the slits SL1, SL2, SL3 adjacent to the floating gates FG1, FG2, and which furthermore may cover, adjacent to the respective floating transistor, a further area portion of the connection path AL1, AL2; AL4, AL5; AL01, AL02; AL04, AL05 (i.e., active area) between the access transistor AT1, AT2, AT01, AT02 and the corresponding floating transistor FT1, FT2, FT0, FT02, respectively (see FIG. 3).

In the second embodiment, area {BLCONT} is defined as the union of $$\{CG\_SFG\}_{Flash+upsize} \text{ and } \{Active\_BL\}_{Flash};$$
$$\{BLCONT\}=\{\{CG\_SFG\}_{Flash+upsize} \text{ AND}$$
$$\{Active\_BL\}_{Flash}\} \quad (9)$$

Then the active mask $\{Active\}_{CMOS}$ is defined in accordance with eq. 2. All other mask manipulations, except for the contact mask, remain the same as for the first embodiment. Note that the contact mask for the second embodiment remains substantially identical to the contact mask for Flash; in the mask set of baseline masks only layout relating to the floating transistor FT1; FT2; FT01; FT02 is changed.

Moreover, the bits of program code C in each ROM memory cell RM1; RM2 are defined by the {Active} mask by defining the first (third) connection path L1; L3 in dependence on the actual bit value for that ROM memory cell as explained with reference to FIG. 12.

Thus, $\{Active\}_{CMOS}$ is adapted by performing a logical AND operation on the active mask with {ROM code at $\{CG\_SFG\}_{Flash+upsize} \times \{Active\_BL\}\}$, where $\{CG\_SFG\}_{Flash+upsize} \times \{Active\_BL\}$ denotes the area as occupied by CG adjacent to the slit area SL1; SL2; SL3 and on top of the floating gate FG1; FG2, plus the area of {Active_BL}.

FIG. 14a shows a cross-sectional view of a ROM memory cell which comprises a connection over the first connection path L1. FIG. 14b shows a cross-sectional view of a ROM memory cell which comprises no connection over the third connection path L3.

In FIGS. 14a and 14b entities with the same reference number refer to identical entities as shown in the preceding Figures.

In FIG. 14a the connection path L1 extends from the active area 4 under contact stud CS1 to the channel region of transistor T1 for allowing conductance between contact CC2 and contact stud CS1 through the connection path L1.

In FIG. 14b, however, the active area 4 is disconnected from the channel region of the transistor by means of the shallow trench isolation STI-2. No conductance between the ROM memory cell contacts CC2 and CS1 (at least above the aforementioned threshold) is possible here.

FIG. 15 shows a cross-sectional view of the ROM memory cell of FIG. 14b after definition of the second insulating layer OX2 and the bitline or 'metal-1' connection BLcmos. On top of contact stud CS1 the common contact CC5 to the bitline BLcmos is located in the second insulating layer OX2.

It is to be noted that according to the present invention, the Flash-to-ROM conversion as discussed above for 2T Flash memory cells advantageously enables all masks dedicated to formation of programmable non-volatile (Flash) memory to be omitted. Only the masks needed for CMOS (or baseline) processing are still needed. Of these masks some need to be modified to incorporate the ROM memory cells which were formerly Flash memory cells and the devices in the peripheral circuitry 130. No re-design of the SOC device 100; 200 is needed and no additional masks need to be introduced in addition to the original number of CMOS-dedicated baseline masks.

It is also noted that embodiments in accordance with the present invention have their own specific advantage.

The first embodiment provides programming of the ROM memory at a rather late stage of processing (in the contact level), which allows for high flexibility during manufacturing. In principle, SOC devices 200 can be processed following a general procedure and can be customized at a relatively late stage.

The second embodiment may be simpler in its implementation but shows less flexibility during manufacturing, since the customization takes place at a very early stage of processing.

Also, it is noted that the mask manipulation scheme in accordance with the present invention requires the assistance of (a) computer(s) which is (are) programmed to carry out calculations on the layout of the pattern masks for lithographic processing, in particular the baseline masks, in relation to the conversion from Flash to ROM memory cells, and which prepare(s) the lithographic pattern to be created on the modified CMOS baseline masks.

A computer as such is well known to persons skilled in the art. The computer is arranged for receiving, as input data, digital representations of masks relating to either the non-volatile technology Flash or the baseline technology CMOS, for processing the input data to obtain data of digital representations of the baseline masks in accordance with the required Flash-to-ROM mask manipulation and for outputting of digital representations of those baseline masks after the calculations relating to the Flash-to-ROM conversion according to the present invention.

Therefore, the present invention also relates to a computer system and program for changing the layout of masks in accordance with the method for conversion.

The invention claimed is:

1. Method for conversion of a Flash memory cell on a first semiconductor device to a ROM memory cell on a second semiconductor device, the first and second semiconductor devices each being arranged on a semiconductor substrate and each comprising an identical device portion and an identical wiring scheme for wiring the device portion to the Flash memory cell and to the ROM memory cell, respectively;

the Flash memory cell being made in non-volatile memory technology using at least one non-volatile technology mask and comprising an access transistor and a floating transistor, the floating transistor comprising a floating gate and a control gate;

the ROM memory cell being made in a baseline technology using at least one baseline mask and comprising a single gate transistor which method includes manipulating a layout of the at least one baseline mask;

the manipulation comprising:

incorporating into a layout of the at least one baseline mask a layout of the Flash memory cell, and converting the layout of the Flash memory cell in the at least one baseline mask to a layout of one ROM memory cell by eliminating, from the at least one baseline mask, a layout for the floating transistor from the layout of the Flash memory cell and designating a layout of the access transistor of the Flash memory cell as a layout of the single gate transistor of the ROM memory cell, wherein the Flash memory cell is paired with a second Flash memory cell that share a common contact, and the manipulation of the at least one baseline mask comprises: elimination of a layout of the common contact from the at least one baseline mask, and creating a layout for a ROM memory cell contact at the location of the former floating transistor.

2. Method for conversion of a Flash memory cell to a ROM memory cell, in accordance with claim 1, wherein the creation of the layout for the ROM memory cell contact comprises a modification of the at least one baseline mask for programming the ROM memory cell in accordance with a bit value of a bit in a program code, the program code, in use, providing functionality to the second semiconductor device; and the bit is arranged to be stored in the ROM memory cell.

3. Method for conversion of a Flash memory cell to a ROM memory cell, in accordance with claim 2, wherein the bit value has either a first bit-state or a second bit-state value; in which modification process of the at least one baseline mask, the creation of the layout for the ROM memory cell contact takes place only if the bit to be stored has one predetermined value from the first and second bit-state values.

4. Method for conversion of a Flash memory cell to a ROM memory cell, in accordance with claim 1, wherein the manipulation of the at least one baseline mask comprises:
the creation of a layout for a via between two adjacent metallization-levels of the second semiconductor device, and
a modification of the at least one baseline mask for creating the layout for the via for programming the ROM memory cell in accordance with a bit value of a bit in a program code, the program code, in use, providing functionality to the second semiconductor device; and the bit is arranged to be stored in the ROM memory cell.

5. Method for conversion of a Flash memory cell to a ROM memory cell, in accordance with claim 4, wherein the bit value has either a first bit-state or a second bit-state value, in which modification process of the at least one baseline mask, the creation of the via takes place only if the bit to be stored has one predetermined value from the first and second bit-state values.

6. Method for conversion of a Flash memory cell to a ROM memory cell, in accordance with claim 1, wherein the ROM memory cell contact comprises a contact stud.

7. Method for conversion of a Flash memory cell to a ROM memory cell, in accordance with claim 1, wherein the at least one baseline mask is manipulated in such a way that at the location of the eliminated common contact a field oxide or shallow trench isolation region is defined.

8. Method for conversion of a Flash memory cell to a ROM memory cell, in accordance with claim 1, wherein the Flash memory cell is paired with a second Flash memory cell that shares a common contact, and the manipulation of the at least one baseline mask comprises:
elimination of the layout of the floating transistor from the at least one baseline mask, and
creating a layout for a connection path between the common contact and the single gate transistor.

9. Method for conversion of a Flash memory cell to a ROM memory cell, in accordance with claim 8, wherein the creation of the layout for the connection path comprises a modification of the at least one baseline mask for programming the ROM memory cell in accordance with a bit value of a bit in a program code, the program code, in use, providing functionality to the second semiconductor device; and the bit is arranged to be stored in the ROM memory cell.

10. Method for conversion of a Flash memory cell to a ROM memory cell, in accordance with claim 9, wherein the bit value has either a first bit-state or a second bit-state value; in which modification process of the at least one baseline mask, the creation of the layout for the connection path takes place only if the bit to be stored has one predetermined value from the first and second bit-state values.

11. Method for conversion of a Flash memory cell to a ROM memory cell, in accordance with claim 10, wherein the at least one baseline mask is manipulated in such a way that if, in the modification of the at least one baseline mask, the creation of the layout for the connection path does not take place, then, at the location of the eliminated floating transistor, a field oxide or shallow trench isolation region is defined.

12. Method for conversion of a Flash memory cell to a ROM memory cell, in accordance with claim 1, wherein the at least one baseline mask comprises at least one of: a mask for defining active area, a mask for defining poly-Si area, a mask for defining contact area, a mask for defining local interconnect area, and at least one mask for defining lightly doped area, on the second semiconductor device.

13. Method for conversion of a Flash memory cell to a ROM memory cell, in accordance with claim 1, wherein the Flash memory cell is arranged with a periphery circuitry which is arranged between the wiring scheme and the Flash memory cell for controlling operations of the Flash memory cell, and the manipulation of the at least one baseline mask comprises a modification of the at least one baseline mask for conversion of any n-channel and p-channel devices comprised by the peripheral circuitry, into baseline CMOS n-channel and p-channel devices, respectively, the modification relating to at least one of: a layout of at least one mask for defining p-well and n-well area, a layout of a mask for defining gate oxide area, and a layout of the at least one mask for defining lightly doped area, on the second semiconductor device.

14. Method for conversion of a Flash memory cell to a ROM memory cell, in accordance with claim 1, wherein the manufacturing of the second semiconductor device comprises lithographic processing using the at least one baseline mask.

15. Second semiconductor device comprising a ROM memory cell converted from a first semiconductor device comprising a Flash memory cell; the first and second semiconductor devices each comprising an identical device portion and an identical wiring scheme for wiring the device portion to the Flash memory cell and to the ROM memory cell, respectively, wherein the Flash memory cell has been replaced by the ROM memory cell during lithographic processing by: incorporating into a layout of at least one baseline mask a layout of the Flash memory cell, and converting the layout of the Flash memory cell in the at least one baseline mask to a layout of the ROM memory cell by eliminating, from the at least one baseline mask, a layout for the floating transistor from the layout of the Flash memory cell and designating a layout of an access transistor of the Flash memory cell as a layout of the single gate transistor of the ROM memory cell, wherein the Flash memory cell is paired with a second Flash memory cell that share a common contact, and wherein the Flash memory cell is replaced by the ROM memory cell by: elimination of a layout of the common contact from the at least one baseline mask, and creating a layout for a ROM memory cell contact at the location of the former floating transistor.

16. Computer program for carrying out calculations on the layout of the baseline masks in accordance with the method of claim 1, wherein the computer program, after being loaded on a computer, allows the computer to carry out the following operations:
manipulating a layout of at least one baseline mask as used in the baseline technology;
the manipulation comprising:
incorporating into the layout of the at least one baseline mask a layout of a Flash memory cell, and converting the layout of the Flash memory cell in the at least one baseline mask to a layout of a ROM memory cell by eliminating, from the at least one baseline mask, a layout for the floating transistor from the layout of the Flash memory cell and designating a layout of the access transistor of the Flash memory cell as a layout of the single gate transistor of the ROM memory cell.

17. The second semiconductor device of claim 15, wherein the Flash memory cell is replaced by the ROM memory cell by:
the creation of a layout for a via between two adjacent metallization-levels of the second semiconductor device, and
a modification of the at least one baseline mask for creating the layout for the via for programming the ROM memory cell in accordance with a bit value of a bit in a program code, the program code, in use, providing functionality to the second semiconductor device; and the bit is arranged to be stored in the ROM memory cell.

18. The second semiconductor device of claim 15, wherein the at least one baseline mask is manipulated in such a way that at the location of the eliminated common contact a field oxide or shallow trench isolation region is defined.

19. Method for conversion of a Flash memory cell on a first semiconductor device to a ROM memory cell on a second semiconductor device, the first and second semiconductor devices each being arranged on a semiconductor substrate and each comprising an identical device portion and an identical wiring scheme for wiring the device portion to the Flash memory cell and to the ROM memory cell, respectively;
the Flash memory cell being made in non-volatile memory technology using at least one non-volatile technology mask and comprising an access transistor and a floating transistor, the floating transistor comprising a floating gate and a control gate;
the ROM memory cell being made in a baseline technology using at least one baseline mask and comprising a single gate transistor
which method includes manipulating a layout of the at least one baseline mask;
the manipulation comprising:
incorporating into a layout of the at least one baseline mask a layout of the Flash memory cell, and
converting the layout of the Flash memory cell in the at least one baseline mask to a layout of one ROM memory cell by eliminating, from the at least one baseline mask, a layout for the floating transistor from the layout of the Flash memory cell and designating a layout of the access transistor of the Flash memory cell as a layout of the single gate transistor of the ROM memory cell, wherein the Flash memory cell is arranged with a periphery circuitry which is arranged between the wiring scheme and the Flash memory cell for controlling operations of the Flash memory cell, and the manipulation of the at least one baseline mask comprises a modification of the at least one baseline mask for conversion of any n-channel and p-channel devices comprised by the peripheral circuitry, into baseline CMOS n-channel and p-channel devices, respectively, the modification relating to at least one of: a layout of at least one mask for defining p-well and n-well area, a layout of a mask for defining gate oxide area, and a layout of the at least one mask for defining lightly doped area, on the second semiconductor device.

* * * * *